(12) United States Patent
Karrer et al.

(10) Patent No.: US 7,542,291 B2
(45) Date of Patent: Jun. 2, 2009

(54) ELECTRONIC CIRCUIT CONFIGURATION HAVING A PRINTED CIRCUIT BOARD THERMALLY COUPLED TO A HEAT SINK

(75) Inventors: Volker Karrer, Regensburg (DE);
Bernhard Lichtinger, Sünching (DE);
Johannes Mehler, Regensburg (DE);
Folker Renken, Regensburg (DE);
Florian Schupp, Regensburg (DE);
Arnoud Smit, Regensburg (DE)

(73) Assignee: Siemens VDO Automotive Aktiengesellschaft, Munich (DE)

( * ) Notice: Subject to any disclaimer, the term of this patent is extended or adjusted under 35 U.S.C. 154(b) by 29 days.

(21) Appl. No.: 11/821,154

(22) Filed: Jun. 22, 2007

(65) Prior Publication Data

US 2007/0297145 A1 Dec. 27, 2007

(30) Foreign Application Priority Data

Jun. 22, 2006 (DE) .................. 10 2006 028 675

(51) Int. Cl.
*H05K 7/20* (2006.01)
(52) U.S. Cl. .................. 361/699; 361/688; 361/689; 257/714; 165/80.3; 165/80.4; 165/104.33
(58) Field of Classification Search .................. None
See application file for complete search history.

(56) References Cited

U.S. PATENT DOCUMENTS

| | | | | |
|---|---|---|---|---|
| 5,087,505 A | | 2/1992 | Schulz-Harder | |
| 5,262,921 A | * | 11/1993 | Lamers | 361/699 |
| 5,455,458 A | * | 10/1995 | Quon et al. | 257/714 |
| 5,763,951 A | * | 6/1998 | Hamilton et al. | 257/714 |
| 5,870,823 A | * | 2/1999 | Bezama et al. | 29/848 |
| 5,901,037 A | * | 5/1999 | Hamilton et al. | 361/699 |
| 6,016,007 A | * | 1/2000 | Sanger et al. | 257/714 |
| 6,055,154 A | * | 4/2000 | Azar | 361/688 |
| 6,232,657 B1 | * | 5/2001 | Komorita et al. | 257/700 |
| 6,400,012 B1 | * | 6/2002 | Miller et al. | 257/712 |
| 6,473,303 B2 | * | 10/2002 | Kaufmann | 361/699 |
| 6,594,149 B2 | * | 7/2003 | Yamada et al. | 361/699 |
| 6,799,628 B1 | | 10/2004 | Masseth et al. | |
| 6,952,347 B2 | | 10/2005 | Baeumel et al. | |
| 6,987,670 B2 | * | 1/2006 | Ahmed et al. | 361/699 |
| 6,992,887 B2 | * | 1/2006 | Jairazbhoy et al. | 361/689 |
| 7,215,547 B2 | * | 5/2007 | Chang et al. | 361/701 |
| 2006/0023426 A1 | | 2/2006 | Murakami et al. | |
| 2006/0067373 A1 | | 3/2006 | Alander | |

FOREIGN PATENT DOCUMENTS

| | | |
|---|---|---|
| DE | 39 13 161 A1 | 10/1990 |
| DE | 40 12 100 A1 | 10/1991 |
| DE | 195 14 548 C1 | 10/1996 |
| DE | 101 02 621 A1 | 8/2002 |

(Continued)

*Primary Examiner*—Boris L Chervinsky
(74) *Attorney, Agent, or Firm*—Laurence A. Greenberg; Werner H. Stemer; Ralph E. Locher

(57) ABSTRACT

In order to improve the heat dissipation capacity in an electronic circuit configuration with one or more printed circuit boards thermally coupled by one flat side to a heat sink having at least one coolant duct, the flat side immediately adjoins the coolant duct.

12 Claims, 4 Drawing Sheets

FOREIGN PATENT DOCUMENTS

| | | |
|---|---|---|
| DE | 698 21 779 T2 | 12/2004 |
| DE | 10 2005 034 367 A1 | 3/2006 |
| DE | 10 2005 040 453 A1 | 4/2006 |
| GB | 2 300 072 A | 10/1996 |
| JP | 09121557 A | 5/1997 |
| JP | 11163572 A | 6/1999 |
| WO | 99/14807 | 3/1999 |

* cited by examiner

ELECTRONIC CIRCUIT CONFIGURATION HAVING A PRINTED CIRCUIT BOARD THERMALLY COUPLED TO A HEAT SINK

CROSS-REFERENCE TO RELATED APPLICATION

This application claims the priority, under 35 U.S.C. § 119, of German application DE 10 2006 028 675.8, filed Jun. 22, 2006; the prior application is herewith incorporated by reference in its entirety.

BACKGROUND OF THE INVENTION

Field of the Invention

The present invention relates to an electronic circuit configuration, comprising at least one printed circuit board for the wiring of components of the circuit. The printed circuit board is coupled by one flat side thermally to a heat sink having at least one coolant duct.

Such circuit configurations are known in many different forms particularly in the field of power electronics and have the advantage that heat arising during operation of the electrical or electronic components may be dissipated to a cooling medium (e.g. cooling liquid) that is flowing through the coolant duct.

In the known circuit configurations the printed circuit board ("substrate") is equipped at one flat side (upper side) with components and connected at the opposite flat side (underside) with the aid of a solder paste to a first, solid metal heat sink. In this case, both the underside of the substrate as well as the solid metal first heat sink are mostly made of a copper alloy to allow the soldering process to be realized with a conventional solder paste. This first heat sink is subsequently connected in a further step with the aid of a heat transfer compound and/or a heat transfer adhesive to a second heat sink, through which the coolant is able to flow.

The drawbacks of this prior art are the comparatively large manufacturing outlay as well as the more or less high heat transfer resistances from the printed circuit board to the first heat sink, on the one hand, and from the first heat sink to the second (e.g. liquid-cooled) heat sink, on the other hand.

SUMMARY OF THE INVENTION

It is accordingly an object of the invention to provide an electronic circuit with a PCB that is thermally coupled to a heat sink which overcomes the above-mentioned disadvantages of the heretofore-known devices and methods of this general type and which is further improved in terms of the heat dissipation capacity of the circuit configuration.

With the foregoing and other objects in view there is provided, in accordance with the invention, an electronic circuit configuration, comprising:

at least one printed circuit board for the wiring of components of the circuit configuration;

a heat sink thermally coupled to a flat side of the printed circuit board, the heat sink having at least one coolant duct, and the flat side of the printed circuit board immediately adjoining the coolant duct.

In other words, the objects of the invention are achieved in that the flat side of the printed circuit board immediately adjoins the coolant duct.

This advantageously results in a direct heat dissipation path from the printed circuit board to the cooling medium. Thus, in practice, a particularly rapid and efficient cooling of the printed circuit board and/or of the components may be effected by means of a heat sink with "integrated cooler." With the invention there are fewer occurrences of a failure point, namely the previously full-surface mounting of a separate heat sink plate. The solid component or components of the "heat sink" in the sense of the invention serve primarily as a delimitation of a cooling medium that absorbs heat during operation. These components may themselves have a heat sink function. However, this is not mandatory.

A further advantage of the invention is that the flat side thermally coupled to the heat sink, hereinafter referred to also as "underside," may be designed and/or modified in diverse ways to achieve an optimum heat transfer. In contrast to the full-surface soldered connection of the underside known from the prior art, the configuration according to the invention leads to greater freedom both in terms of the material of the underside and in terms of the shaping. Given a defined heat dissipation capacity, the invention moreover advantageously reduces both the manufacturing outlay and the installation space (orthogonally to the plane of the printed circuit board).

A preferred use of the circuit configuration is in the field of automotive electronics, in particular the power electronics of the kind required there e.g. in so-called control units (e.g. engine control unit etc.).

The cooling medium is preferably a cooling liquid. In the case of use in the electronics of a motor vehicle, the heat sink may for example be supplied with the cooling water that is in any case provided in the cooling circuit for an internal combustion engine. An alternative or additional possibility is the connection of the heat sink to a cooling medium circuit specially provided for this purpose.

For the design of the printed circuit board and/or of the substrate, technologies common in the field of power electronics may be used. Quite generally suitable is a laminated construction of one or more printed conductor layers, which have been at least partially configured to form printed conductors (and optionally "plated-through"), and one or more insulating layers (dielectric substrate) at least between mutually adjacent printed conductor layers. In a particularly preferred embodiment, the printed circuit board has a ceramic substrate material and one or more printed conductor layers of metal material. A design particularly preferred in this case is a so-called DCB substrate ((DCB=direct copper bonding). Common DCB substrates that are eminently suitable in the context of the invention comprise a ceramic isolator, mostly $Al_2O_3$ (aluminum oxide) or AlN (aluminum nitride), on which in a high-temperature melting and diffusing process more or less pure copper is applied and strongly adhesively bonded to the ceramic material. Such substrates advantageously have a high thermal conductivity and, given a suitably thick copper coating (e.g. 100 to 800 µm), also a high thermal capacitance through the printed conductor layers. A further advantageous result is for example a comparatively low difference between the coefficients of thermal expansion of the ceramic material and the silicon material that is advantageous for power electronics, for example silicon chips applied in an unenclosed manner.

Although with the invention a fitting of components on both sides of the printed circuit board is not ruled out in principle, this fitting is preferably provided on one side, on a flat side remote from the coolant duct.

In a preferred embodiment, the flat side adjoining the coolant duct is formed by a metal layer, e.g. a metal layer (e.g. copper layer) that extends over the entire surface of the printed circuit board.

A boundary region extending e.g. in the form of a closed ring around the underside of the printed circuit board may be connected in a cooling-medium-proof manner, e.g. by an adhesive or soldered connection, to a boundary region extending in a correspondingly ring-shaped manner around the heat sink. For this configuration it is possible to use e.g. a conventional DCB substrate (with an all-over copper coating on the underside), which is soldered all the way round a boundary region of its underside to a flat connection surface that extends in the shape of a closed ring around the heat sink. The sealing connection of the underside of the printed circuit board to the heat sink having the coolant duct may alternatively be realized by the interposition of a seal. In a preferred embodiment, the printed circuit board is a DCB substrate having one or more printed conductor layers, for example a top configured copper layer with components fitted and a bottom copper layer that communicates in part with the cooling medium and in part with a connection surface of the heat sink.

In a development of the invention, the flat side of the printed circuit board that adjoins the coolant duct is designed with a structure that enlarges the cooling surface. The structure may comprise e.g. at least one structural body, which projects in a two-dimensionally extended manner away from the flat side into the coolant duct and which may be formed e.g. by a heat-conducting sheet (e.g. metal sheet).

With one or more of the above-mentioned structural bodies it is advantageously possible not only to enlarge the surface crucial for the heat transfer but also, depending on the concrete configuration, to achieve a mechanically stabilizing effect for the printed circuit board in question. This is of great practical importance particularly with regard to any flow- and/or pressure fluctuations in the coolant duct. Conventional—and therefore to be preferred—coolant pumps that are used in the context of the invention to supply the coolant duct with a cooling medium (e.g. gear pumps, reciprocating pumps etc.) often generate pulsations, which might allow the substrate to sag. This problem may be eliminated by a suitable arrangement (e.g. fitting) of stabilizing parts between the printed circuit board and an inner wall of the heat sink that delimits the coolant duct. In a particularly advantageous manner, such stabilizing parts in the form of the structural bodies mentioned above may simultaneously improve the heat dissipation capacity of the system.

For the provision of structural bodies (for improving the heat dissipation and/or for mechanical stabilization) there are many different possibilities.

In one variant, it is provided that the structural body is designed directly as a bent metal portion of a metal layer forming the flat side of the printed circuit board.

In another variant, it is provided that the structural body is fastened to a metal layer forming the flat side of the printed circuit board.

For both variants, which may also be combined with one another, it is particularly advantageous for achieving a mechanical stabilization if a portion of the structural body that is spaced apart from the flat side is fastened to an inner wall of the heat sink that delimits the coolant duct.

For the fastening of one or more structural bodies to the underside of the substrate and/or to an inner wall portion of the heat sink a soldered connection is particularly suitable. The structural body or bodies preferably take the form of a metal sheet or sheets. In a preferred embodiment, such a stabilizing and/or cooling metal sheet extends in a zigzag manner between the substrate underside and an opposite inner wall of the heat sink that likewise adjoins the coolant duct. This inner wall may extend e.g. substantially parallel to the substrate underside (flat side).

Other features which are considered as characteristic for the invention are set forth in the appended claims.

Although the invention is illustrated and described herein as embodied in electronic circuit configuration having a printed circuit board coupled thermally to a heat sink, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
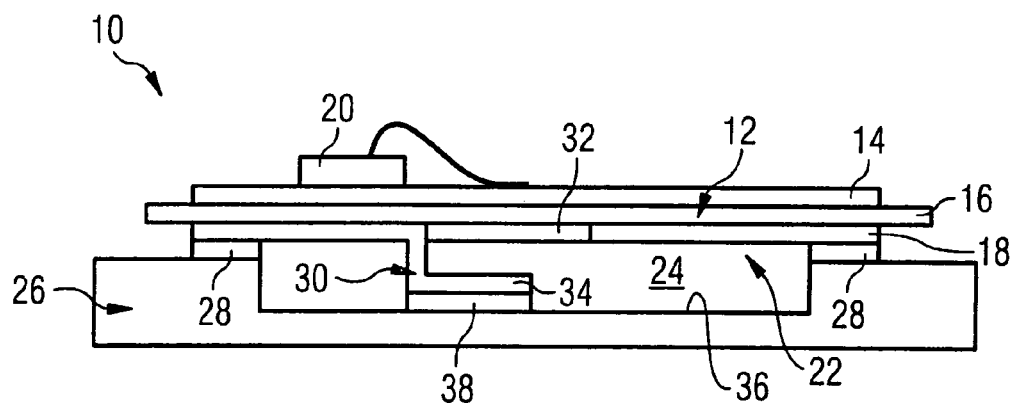
FIG. 1 a diagrammatic side view of a circuit configuration according to a first exemplary embodiment of the invention.

Referring now to the figures of the drawing in detail and first, particularly, to FIG. 1 thereof, there is shown an electronic circuit configuration 10, comprising a printed circuit board in the form of a DCB substrate 12 comprising a top copper layer 14, a ceramic material 16 and a bottom copper layer 18, for the wiring of components of the circuit configuration, of which components for the sake of simplicity only one is shown in the drawing and denoted by 20.

The top conductive layer 14 of the substrate 12 is configured in a conventional manner to form printed conductors (not shown). The illustrated component 20 is an unenclosed chip ("bare die") of power electronics formed by the circuit configuration 10.

The illustrated electronic unit may, for example, be a control unit, which is to be installed close to the engine in a motor vehicle and in this installation environment is exposed to a raised ambient temperature.

The substrate 12 is of a uniform thickness and a rectangular shape and is coupled by a bottom flat side 22 thermally to a heat sink 26 comprising at least one cooling water duct 24 in that the flat side 22 immediately adjoins the cooling water duct 24. In other words, a central, portion of the bottom flat side 22 shown in FIG. 1 forms an upper boundary of the cooling water duct 24, which is delimited laterally and in a downward direction by the material of the heat sink (here: copper).

Because of this direct thermal connection of the substrate 12 a very rapid and efficient dissipation of heat from the components to the cooling water may be effected during operation of the circuit configuration 10.

The sealing of the cooling water duct 24 in the transition region between substrate 12 and heat sink 26 is realized in the illustrated exemplary embodiment by means of a soldered connection that extends all around the boundary region of the bottom flat side 22 (solder layer 28).

In a particularly simple, non-illustrated embodiment, the upper boundary of the cooling water duct 24 is formed by the central portion of an all-over copper layer on the underside of the substrate 12. In the illustrated exemplary embodiment, however, during manufacture of the DCB substrate 12 a modification was carried out in that the copper layer 18 used to form the bottom flat side 22 was first punched and configured (bent) so as to produce on the finished substrate 12 a plurality of copper sheet vanes 30 projecting down from the flat side 22.

The effect of this modification on the finished circuit configuration is an enlargement of the surface crucial for the cooling effect, because the copper sheet material 30 is in contact with the cooling water on both sides. What is more, the cooling water in each recessed region 32 is advantageously in direct contact with the ceramic material 16 of the DCB substrate 12.

In the illustrated exemplary embodiment, the copper sheet vanes 30 are folded and/or bent downwards in a "double right angle" and each have a flat vane portion 34, which extends parallel and is fastened to an inner wall 36 of the heat sink 26 that delimits the coolant duct 24 in a downward direction. In the illustrated exemplary embodiment, this fastening of the vane portions 34 spaced apart from the flat side 22 is realized in each case by a soldered connection (solder layer 38). The effect achieved by this fastening is that the copper sheet vanes 30 also have a mechanically stabilizing effect on the substrate 12 with regard to flow- and/or pressure fluctuations in the cooling water duct 24, thus making the entire arrangement suitable for a more or less pulsating cooling water supply (without the risk of sagging of the substrate 12 in step with the pressure pulses and/or of excessive loading of the sealing soldered connection 28).

In the following description of further exemplary embodiments, for components of an identical effect the same reference numerals are used, only with the addition in each case of a lower case letter to differentiate the embodiment. The description is confined substantially to the differences from the previously described exemplary embodiment(s) and otherwise express reference is made hereby to the description of previous exemplary embodiments.

Figure 2:
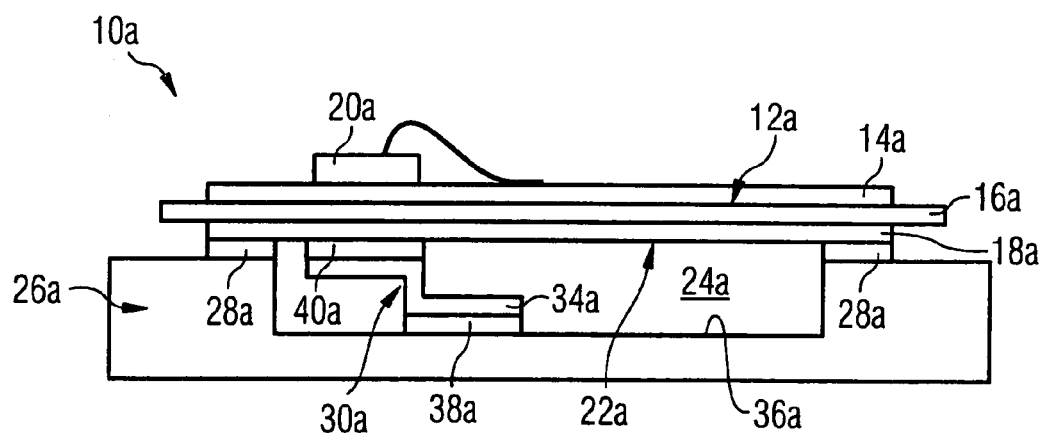
FIG. 2 a diagrammatic side view of a circuit configuration according to a second exemplary embodiment.

FIG. 2 shows a modification of the embodiment described with reference to FIG. 1. In the embodiment illustrated in FIG. 2, copper sheet vanes 30a are formed, not directly as a bent metal portion of an underside metal layer of a substrate (dielectric) 12a, but as individual additional copper sheet vanes which were fastened subsequently, after manufacture of the DCB substrate 12a, to the underside thereof.

In the illustrated exemplary embodiment, this fastening is realized by a soldered connection (solder layer 40a). In the embodiment illustrated in FIG. 2 too, the copper sheet vanes 30a are likewise connected by a portion 34a to an inner wall 36a of the heat sink 26a, so that in addition to an improved cooling effect the advantageous mechanical stabilization of the substrate 12a is also achieved.

Figure 3:
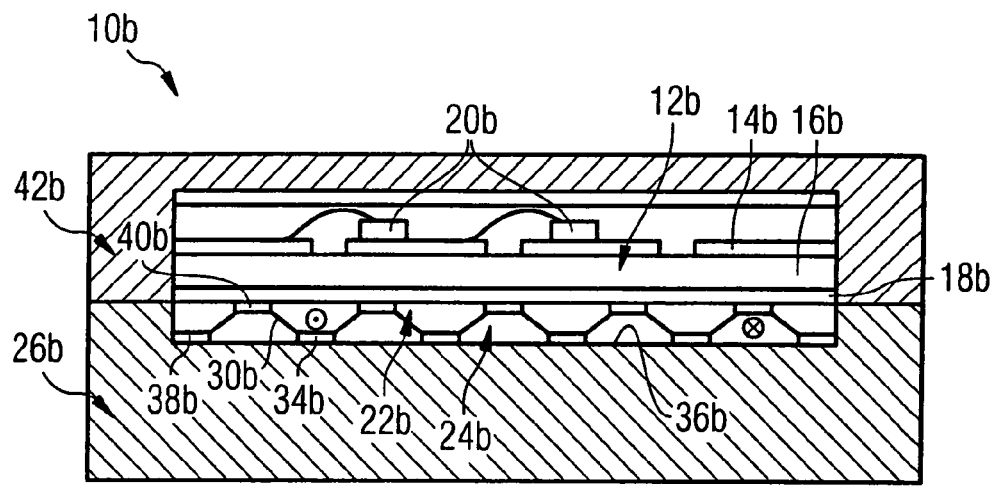
FIG. 3 a diagrammatic side view of a circuit configuration according to a third exemplary embodiment.

FIG. 3 shows a modification of the embodiment described with reference to FIG. 2. In the embodiment illustrated in FIG. 3, a cooling water duct 24b of a heat sink 26b contains a copper sheet 30b, which viewed in cross section is bent into a zigzag shape and of which strip-shaped portions are in the illustrated manner thermally and mechanically connected alternately by solder layers 40b to a bottom flat side 22b of a substrate 12b and by solder layers 38b to an inner wall 36b of the heat sink 26b that is spaced apart from the substrate 12b. With such a structural body 30b it is easily possible to realize e.g. a meandering coolant flow at the underside of the substrate 12b, as is indicated in FIG. 3 by two arrow symbols.

A further difference from the embodiments already described above is that the substrate 12b does not laterally overlap and is not connected in a sealing manner to lateral boundary portions of the heat sink 26b but is disposed entirely within a cavity that is delimited, on the one hand, by the material of the heat sink 26b and, on the other, by the material (metal) of a cover 42b. The cover 42b is in this case connected in a non-illustrated manner to the heat sink 26b so as to extend all round the heat sink 26b in a liquid-proof manner.

The cavity between the substrate 12b and the cover 42b may be filled with a gel, which may in a manner known per se afford protection for the components. In the context of the invention, the use of a gel offers the additional advantage of a mechanical stabilization of the substrate 12b with regard to flow- and/or pressure fluctuations in the coolant duct 24b.

Figure 4:
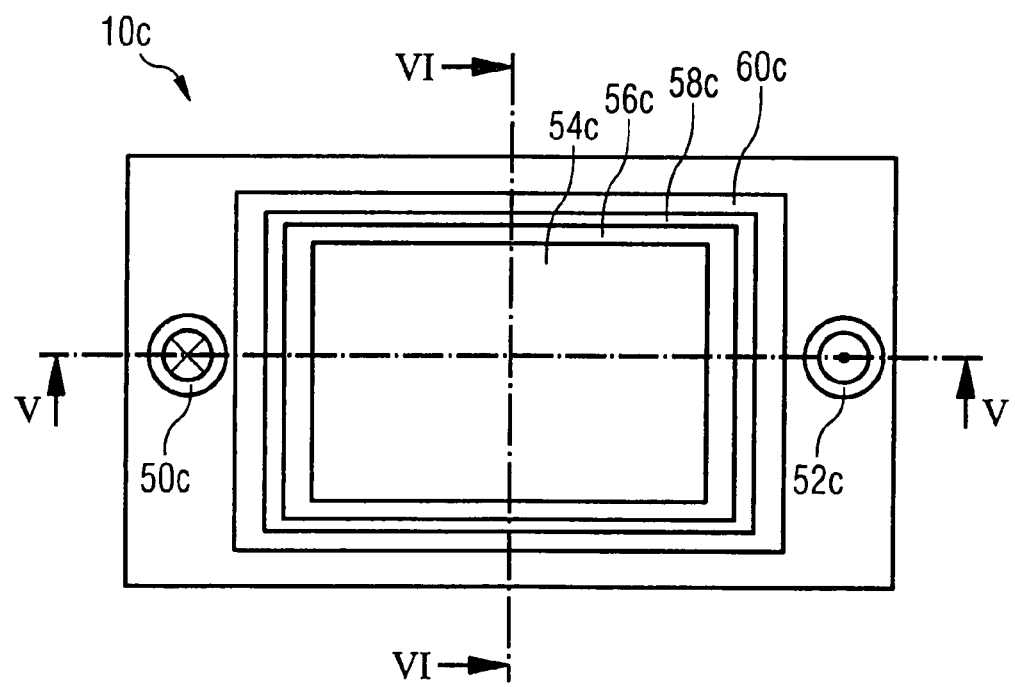
FIG. 4 a diagrammatic plan view of a circuit configuration according to a fourth exemplary embodiment.

FIG. 4 is a diagrammatic plan view of a circuit configuration 10c, in which a modular construction comprising a plurality of stacked circuit configuration modules is provided.

FIG. 4 shows the arrangement of a cooling-water supply channel 50c, which is common to all of the stacked modules, and of a cooling-water discharge channel 52c, which is common to all of the modules. The stacking direction of the modules extends orthogonally to the drawing plane of FIG. 4. This figure further shows a central cooling duct region 54c, a web region 56c, a wall region 58c and an outer sealing region 60c (circumferential seal).

Figure 5:
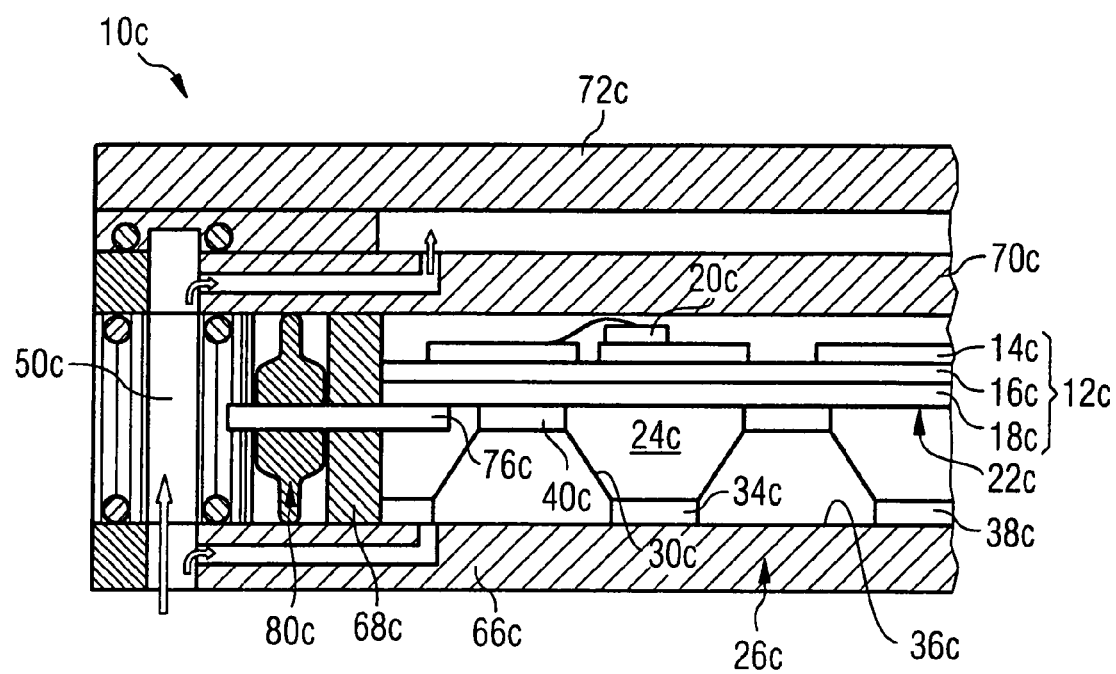
FIG. 5 a portion of a sectional view taken along the line V-V in FIG. 4 and viewed in the direction of the arrows.
Figure 6:
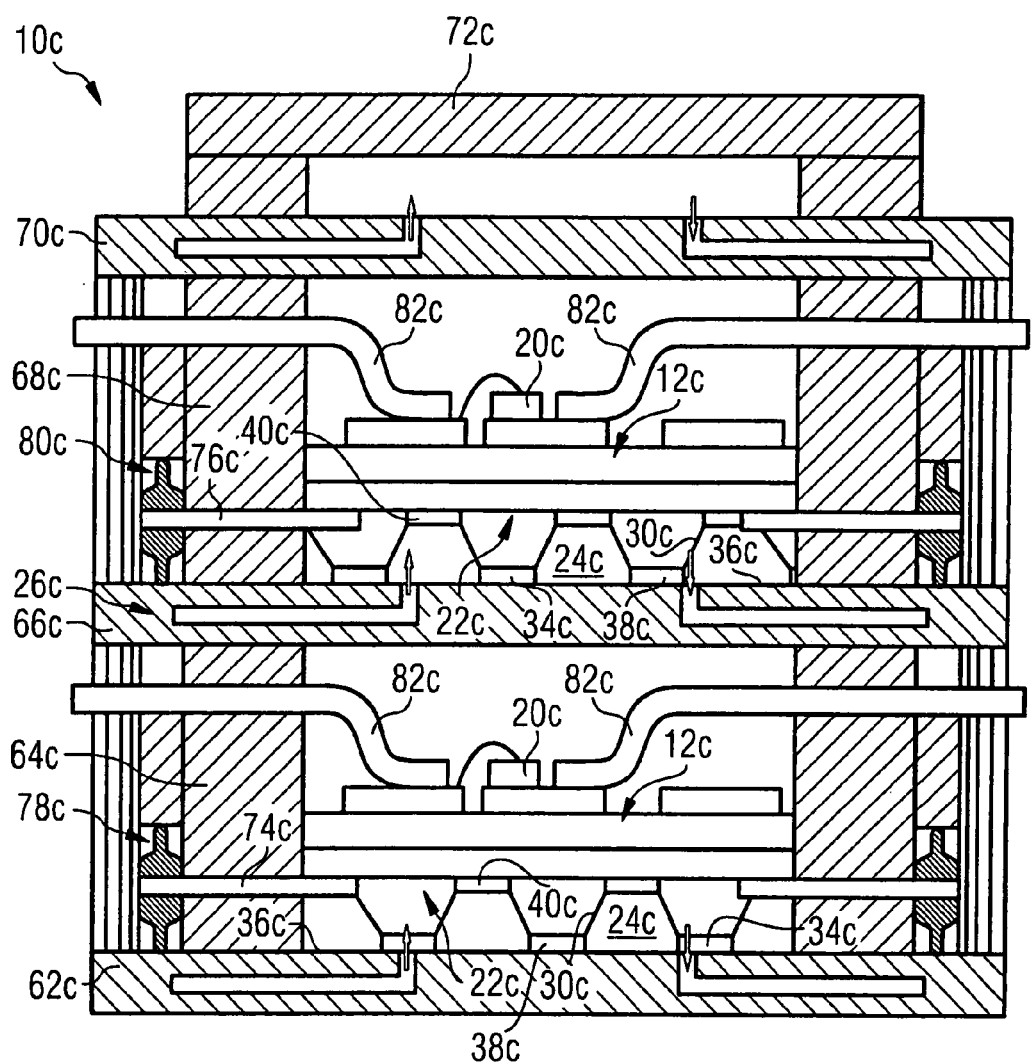
FIG. 6 a sectional view taken along the line VI-VI in FIG. 4 and viewed in the direction of the arrows.

FIGS. 5 and 6 are sectional views along the lines V-V and VI-VI respectively in FIG. 4. For the sake of simplicity of representation, FIG. 5 shows only one of a total of two circuit configuration modules.

As in the embodiments already described above, FIGS. 5 and 6 likewise show substrates 12c, the bottom flat side 22c of each of which is in direct contact with cooling water in a cooling water duct 24c.

A heat sink 26c, which is common to all of the modules, in this case has a plurality of (here: two) cooling water ducts 24c and, as is clearly evident from FIG. 6, is of a modular construction. The base of the heat sink 26c is formed by a first metal plate 62c, by which in the central region a first of the two coolant ducts 24c is delimited. Laterally adjacent thereto, in the wall region 58c (cf. FIG. 4) is an upwardly extending first boundary part 64c, which forms a cavity for forming the cooling water duct 24c and the, in FIG. 6, bottom substrate 12c. This cavity is closed off in an upward direction by a second metal plate 66c, which simultaneously forms a base plate for the, in FIG. 6, top circuit configuration module. The cavity of the top circuit configuration module that contains the top cooling water duct 24c and the top substrate 12c is of a substantially identical design to the bottom module and further comprises a second boundary part 68c and a third metal plate 70c, which closes off the cavity in an upward direction and above which a cover 72c is finally additionally disposed.

Onto the bottom flat sides 22c of each of the substrates 12c a "turbolator sheet" 30c is attached by soldering.

In the illustrated example, there is likewise a flow of cooling liquid through the cover 72c.

A characteristic feature of the arrangement of the substrates 12c is that they are each at their underside 22c attached by soldering in a circumferential boundary region to the upper side of a web 74c and/or 76c that projects from the respective boundary part 64c and/or 68c.

The boundary parts 64c and 68c may be formed e.g. from plastics material, in which during manufacture the webs, web

74c and 76c, were integrated (e.g. as inserts encapsulated by an injection molding process).

Laterally outside of the wall region 58c according to FIG. 4, respective sealing arrangements 78c and 80c are provided in the outer sealing region 60c in order to prevent any cooling water that leaks through the web regions from escaping.

FIG. 6 further shows electrical contacting devices 82c, which have been run through the boundary regions and outer sealing regions, for the further electrical connection of the substrates 12c.

Finally, as may be seen in FIG. 5, disposed laterally outside of the outer sealing region according to FIG. 4 are the cooling-water supply- and cooling-water discharge channels 50c, 52c, which extend in each case from module to module in a sealed manner and communicate with suitable laterally extending water channels in the metal plates 62c, 66c and 70c so that cooling water may be supplied to and discharged from the cooling water ducts 24c (cf. arrows in FIGS. 5 and 6).

With the previously described embodiments an improved connection of a substrate, e.g. of a DCB substrate used in power electronics, to a liquid-cooled heat sink is realized. The basic idea of the invention lies in a direct connection of one or more board-shaped substrates to a cooling medium, with either directly integrated or additionally fitted cooling structural bodies preferably being provided, which may be utilized both to enlarge the cooling surface and for mechanically stabilizing the substrate to prevent possible deformation in the event of a pulsation of the cooling medium. This makes it easily possible to dissipate higher heat losses during operation of the circuit configurations in question and moreover achieve a saving of installation space. The structural bodies mentioned and described in the exemplary embodiments are provided preferably in the form of bent or angular metal sheets and are disposed preferably at least in the vicinity of the component or components of the circuit configuration with the greatest heat loss in order to have as short a thermal connection to the heat sink as possible.

By virtue of the different fitting and/or arrangement of the cooling metal sheets and/or "turbolators," it is moreover possible to realize in the cooling duct(s) a purposefully turbulent and non-laminar flow, which in turn contributes towards improved cooling.

Particularly in the embodiments, in which a cavity accommodating the substrate is closed off, e.g. by the described covers, it is particularly advantageous if this cavity is filled with a gel because this gel may alternatively or in addition to the described structural bodies likewise contribute towards the mechanical stabilization of the substrate.

The invention claimed is:

1. An electronic circuit configuration, comprising:
    at least one printed circuit board for the wiring of components of the circuit configuration, said printed circuit board having at least one flat side and a metal layer on said flat side;
    a heat sink thermally coupled to said flat side and said metal layer, said heat sink having at least one coolant duct formed with an inner wall delimiting the coolant duct opposite said flat side, and said flat side of said printed circuit board immediately adjoining said coolant duct; and
    said metal layer being formed with at least one structure extending from said flat side of said printed circuit board, projecting through said coolant duct, and being attached to said inner wall of said coolant duct opposite said flat side.

2. The circuit configuration according to claim 1, wherein said metal layer is a copper layer.

3. The circuit configuration according to claim 1, wherein said printed circuit board is a direct copper bonding substrate.

4. The circuit configuration according to claim 1, wherein said structure is configured to enlarge a cooling surface.

5. The circuit configuration according to claim 1, wherein said structure is a heat-conducting metal sheet.

6. The circuit configuration according to claim 1, wherein said structure is formed to have a mechanically stabilizing effect on said printed circuit board with regard to flow- and/or pressure fluctuations in said coolant duct.

7. The circuit configuration according to claim 1, wherein said structure is formed directly as a bent metal portion of said metal layer forming said flat side.

8. The circuit configuration according to claim 1, wherein said structure is fastened to said metal layer forming said flat side.

9. An electronic circuit configuration, comprising:
    at least one printed circuit board for the wiring of components of the circuit configuration, said printed circuit board having at least one flat side;
    a heat sink thermally coupled to said flat side, said heat sink having at least one coolant duct formed with an inner wall opposite from said flat side, and said flat side of said printed circuit board immediately adjoining said coolant duct; and
    a structured metal sheet layer attached to said flat side of said printed circuit board and to said inner wall of said heat sink delimiting said coolant duct and having a structure extending through said coolant duct and subdividing said coolant duct into a plurality of coolant ducts.

10. The electronic circuit configuration according to claim 9, wherein said flat side of said printed circuit board is at least partly covered by a metal layer having said structured metal layer attached thereto.

11. The electronic circuit configuration according to claim 9, wherein said metal structure layer is substantially a corrugated metal layer dividing said coolant duct to define therein a meandering coolant flow.

12. The circuit configuration according to claim 1, wherein said at least one structure is an integral portion of said metal layer and a corresponding surface area of said flat side of the printed circuit board adjacent said structure is exposed to the coolant.

* * * * *